United States Patent [19]

Casanova et al.

[11] Patent Number: 5,031,075
[45] Date of Patent: Jul. 9, 1991

[54] DOUBLE-SIDED LOGIC CAGE

[75] Inventors: Wayne J. Casanova; William D. Corfits; Roger F. Dimmick, all of Rochester; Gary A. Thompson, Pine Island; James R. Thorpe, Stewartville; Stephen E. Wheeler, Rochester, all of Minn.

[73] Assignee: International Business Machines Corporation, Armonk, N.Y.

[21] Appl. No.: 467,595

[22] Filed: Jan. 19, 1990

[51] Int. Cl.$^5$ .............................................. H05K 7/14
[52] U.S. Cl. ................................................. 361/415
[58] Field of Search .............. 361/383, 338, 391, 393, 361/412, 413, 415, 424; 439/64, 139; 211/41; 220/22.1, 22.2, 22.6; 174/35 R, 35 C

[56] References Cited

U.S. PATENT DOCUMENTS 3,733,523 5/1973 Reynolds et al. ................... 361/415
4,876,630 10/1989 Dara ..................................... 361/413

FOREIGN PATENT DOCUMENTS 1119920 12/1961 Fed. Rep. of Germany ...... 361/338

OTHER PUBLICATIONS

IBM Tech. Discl. "Double Board Arrangement" 11/70 F. Tsui et al.; vol. 13, No. 6.

Primary Examiner—Leo P. Picard
Assistant Examiner—Donald A. Sparks
Attorney, Agent, or Firm—Paul L. Sjoquist

[57] ABSTRACT

A double-sided central electronics complex (CEC) is provided for increasing the logic card density in a logic cage or CEC. Specifically, two logic cages or sub-enclosures are integrated, sharing one backplane card so that logic elements may be plugged into the CEC from both sides. The CEC is formed by unitary sheet metal side plates, top and bottom cast or guides and a single double-sided backplane assembly.

3 Claims, 3 Drawing Sheets

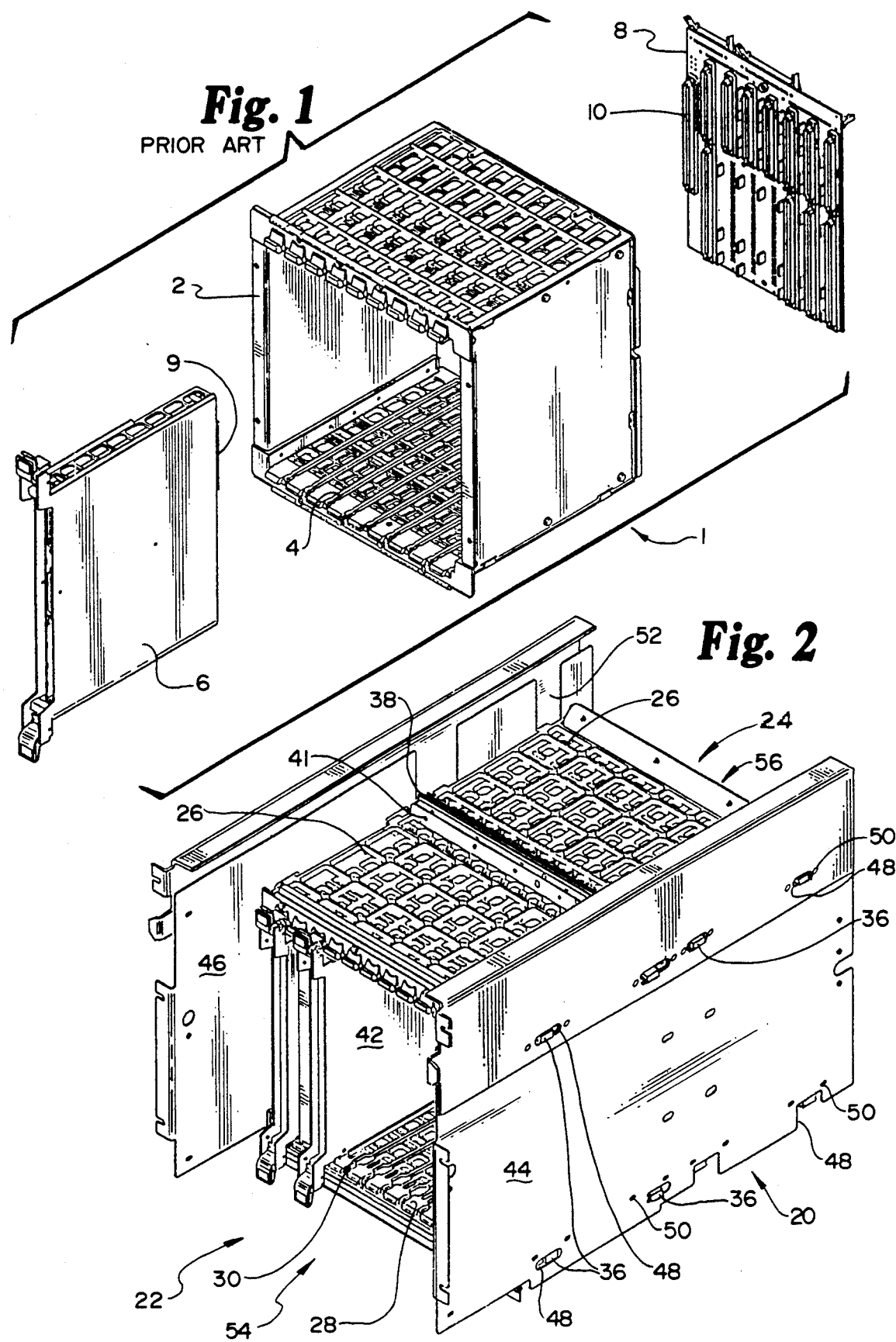

DOUBLE-SIDED LOGIC CAGE

BACKGROUND OF THE INVENTION

This invention relates generally to enclosures for containing logic elements such as computer cards and for guiding and supporting such logic elements while they are plugged into a backplane or mother board. More specifically, this invention relates to such an enclosure or logic cage to efficiently handle an increased number of logic elements.

As computing system evolution has occurred, there have been increases in computing speed, processing power and optional functions. These changes have necessitated relatively larger and increasing numbers of logic elements (e.g., cards or books) required in central electronic complexes (CECs). There are several resultant problems.

Computing speed is affected to a large extent by the electrical path length between logic elements or cards. As the number of cards increases and as cards have gotten larger, the mechanical pitch or the physical distance between cards has increased. This is due to the increasing size of the cards, but also to the need for additional components such as heat sinks or card covers. The increased mechanical pitch equals increased electrical pitch which causes bus length increases and response time increases.

Secondly, as computing capacity has increased, space has become a premium. A CEC currently needs to be put in smaller, more standard enclosures such as EIA racks. In many instances, the increased card numbers and the larger pitch referred to above exceeds the horizontal space available in typical racks. Consequently, logic cages or the enclosures containing the logic elements must be split and electrically interconnected. Clearly, such "daisy-chaining" of logic cages does nothing to alleviate the electrical path length problem and its manifestations referred to above.

Thirdly, as complexity has increased, hardware costs have increased. This is due to the need for multiple cages, additional backplanes or mother boards, added cable, additional connectors, additional cable shielding, etc.

Because a typical CEC wastes significant space in the rack (it is generally much shorter than the rack is deep), it would seem that an obvious solution would be to place two separate CECs or logic cages back-to-back in a rack. However, to mount two typical CECs back-to-back is not practical because the central area where the mother boards or backplanes reside would not be accessible. Further, the CEC-to-CEC interconnection would not be easily accessible to factory or field personnel. For these reasons multiple CECs or logic cages are typically mounted one on top of the other, but the result is inefficient use of rack space.

There have, of course, been attempts to address these problems in the prior art. U.S. Pat. Nos. 4,530,033; 4,620,265; 3,668,476 and 3,564,112 are directed to enclosures which might be used to contain logic elements. In particular, U.S. Pat. No. 4,530,033 discloses a single circuit card frame which has molded sidewalls and panels having integral joint and lock means for assembling the frame. However, there is no method suggested for connecting two frames or cages together.

Additional U.S. Patents which are representative of prior art enclosures are U.S. Pat. Nos. 4,447,856 and 3,184,645 directed to shelf units or separate housings, respectively, wherein the housings or shelf units may be attached together.

SUMMARY OF THE INVENTION

The present invention is directed to and in large part solves the problems discussed above. A double-sided central electronic complex (CEC) is provided for increasing the logic element density in a logic cage or CEC. Specifically, two sub-enclosures or logic cages are integrated, sharing one backplane card so that logic elements may be plugged into the cage from both sides. The cage is formed by unitary sheet metal side plates, top and bottom guides and a single double-sided backplane assembly.

It is a specific advantage and object of the present invention to increase logic element packaging efficiency and the logic element density of logic cages or enclosures.

It is another object of the present invention to provide a double-sided logic cage that incorporates two logic cages or sub-enclosures sharing one backplane or mother board so that logic elements (e.g., books or cards) can be plugged into the cage from both sides.

It is another object of the present invention to provide a logic cage that can be formed by side plates, top and bottom logic element guides and a single backplane assembly, wherein the number of logic elements in the space occupied by a typical prior art single cage is doubled without increasing the height or vertical space occupied by the logic cage.

It is another object of the present invention to provide a double-sided logic cage which exhibits rigidity sufficient to withstand manufacturing, shipping and operational shock and vibration.

It is another object of the present invention to provide a logic cage which minimizes alignment problems by using a single piece side plate providing a double-sided logic cage without side plate bisecting joints and providing that the upper and lower castings or guides may be fastened directly to the side plate along the length thereof.

Further objects, features and advantages of the present invention will be understood with reference to the following specification, the appended drawings and claims.

BRIEF DESCRIPTION OF THE DRAWINGS

FIG. 1 is a partially exploded perspective of a prior art logic cage.

FIG. 2 is a perspective of the double-sided logic cage of the present invention.

DETAILED DESCRIPTION OF THE PREFERRED EMBODIMENT

Figure 3:
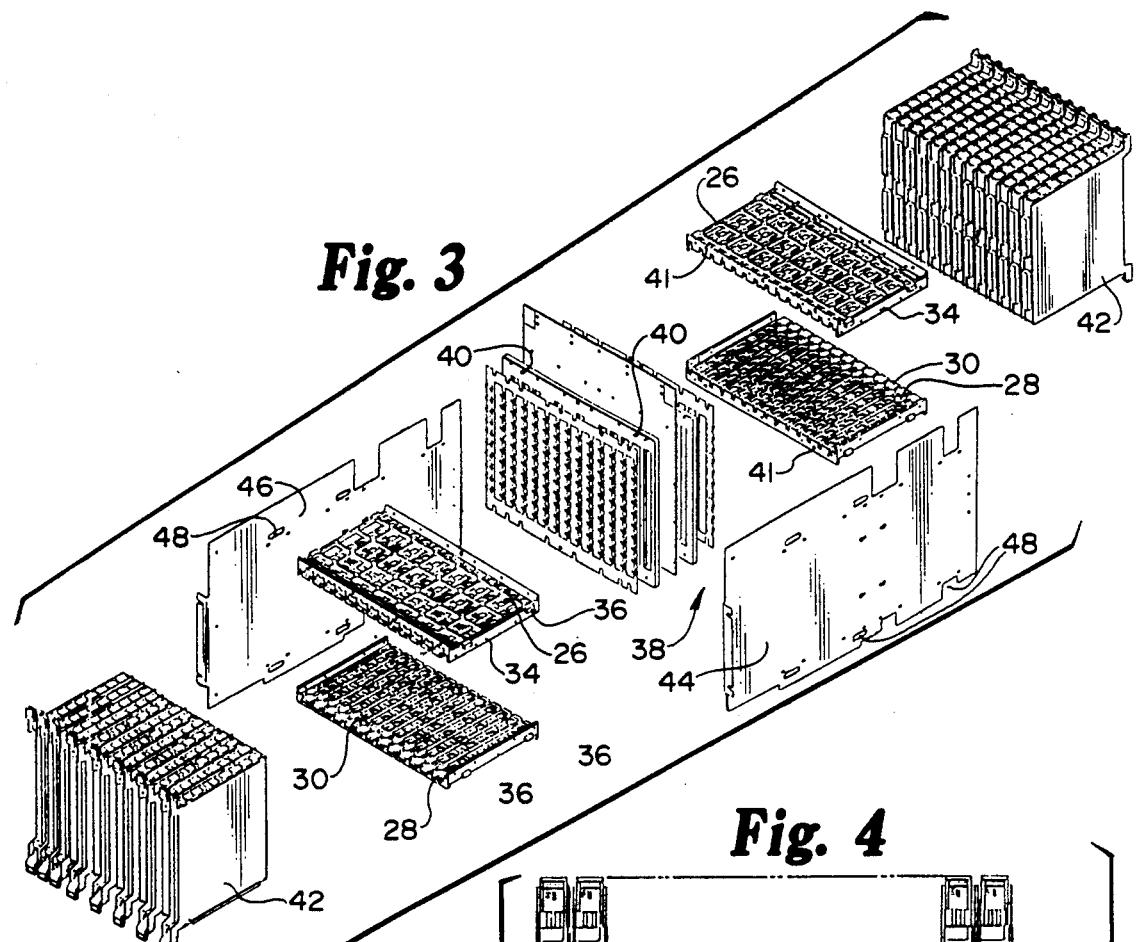
FIG. 3 is an exploded perspective view of the logic cage of the present invention.

To provide further background for the present invention, FIG. 1 shows a typical prior art logic cage indicated generally at 1. The logic cage 1 includes a box-like mechanical structure 2 that has slots 4 to guide logic cards 6 into the proper location for electronically plugging into a backplane 8 mounted at the rear of the cage structure 2. The backplane 8 has connectors 10 for accepting mating connectors 9 on the logic cards 6. The logic cage 1 and associated cards 6 form one of the basic components of computer systems and contain memory, I/0 and workstation cards and the processor complex.

FIGS. 2 and 3 depict the double-sided logic cage 20 of the present invention. The logic cage 20 includes back-to-back enclosures or sub-cages 22 and 24. Each of the sub-cages 22, 24 have top guides 26 and bottom guides 28 with inner guide paths or slots 30. The guides 26, 28 may be cast or may be formed by other suitable materials or processes. The guides 26, 28 have lateral side edges 34 provided with alignment tabs 36 and are secured to a double-sided backplane assembly 38, described in greater detail in the commonly assigned co-pending application entitled DOUBLE-SIDED BACKPLANE ASSEMBLY by Aug, et al. The backplane assembly 38 has alignment pins 40 which are received in alignment holes 41 on the top and bottom guides 26, 28. The guides 26, 28 may be secured to backplane 38 by conventional mechanical attachment means. The top and bottom guides 26, 28 align and support logic elements 42.

The logic sub-cages 22, 24 containing logic elements 42 have side walls formed by side plates 44, 46. The side plates 44, 46 are guided into and fixed in proper relationship with the top and bottom guides 26, 28 and the backplane assembly 38 (attached to guides 26, 28) by apertures 48 which cooperatively engage alignment tabs 36 to properly position the side plates 44, 46. As shown in FIG. 2, side plates 44, 46 have perforations 50 for receiving conventional attachment means (not shown) to secure the guides 26, 28 thereto. Alignment is achieved in at least three orientations: lateral alignment of the sub-cages 22, 24 and guides 26, 28; height alignment of sub-cages 22,24 and guides 26, 28 and sub-cage 22 to sub-cage 24 alignment. This alignment advantage is enabled because the apertures 48 are slightly larger than tabs 36 in one or more dimensions, but have specific ledges precisely located with respect to other apertures 48. When the correct surfaces of tabs 36 are abutted to the precisely located edges of apertures 48, guides 26, 28 are correctly positioned with respect to each other and sub-cages 22, 24 are thus aligned.

Since apertures 48 may be stamped into the side plates 44,46 at the same time, variations between them may be held to extremely close limits without substantially increasing tooling costs. The cooperation between tabs 36 and apertures 48 enable precise vertical alignment of guides 26, 28. Thus, improved alignment between various components of the cage 20 without substantial cost increases is a particular advantage of the present invention. After alignment, the side plates 44, 46 may be fixed to the top and bottom guides 26, 28 and to the backplane 38 by conventional mechanical attachment means (not shown). The guides 26, 28 tabs 36 also provide an alignment provision as required to mount or guide ancillary equipment (not shown).

The alignment of the back-to-back logic sub-cages 22, 24 relative to each other is assured and improved by using single unitary side plates 44, 46. Additionally, the use of single side plates 44, 46 provides substantial rigidity and resistance to operational or shipping vibration and shock. However, it is not beyond the scope of the present invention that four side plates may be used, one for each side of each back-to-back logic sub-cage 22, 24. In this particular alternative embodiment, the side plates would be affixed to the top and bottom guides 26, 28 and the backplane assembly 38 in a similar manner as that described in attaching side plates 44, 46 to form the logic sub-cages or enclosures. When the side plates 44, 46 are affixed, separate back-to-back logic sub-cages 22, 24 are formed sharing a single backplane assembly 38. Each of the logic sub-cages 22, 24 then has open end 54 (cage 22) and open end 56 (cage 24) into which the logic elements 42 are inserted.

Figure 4:
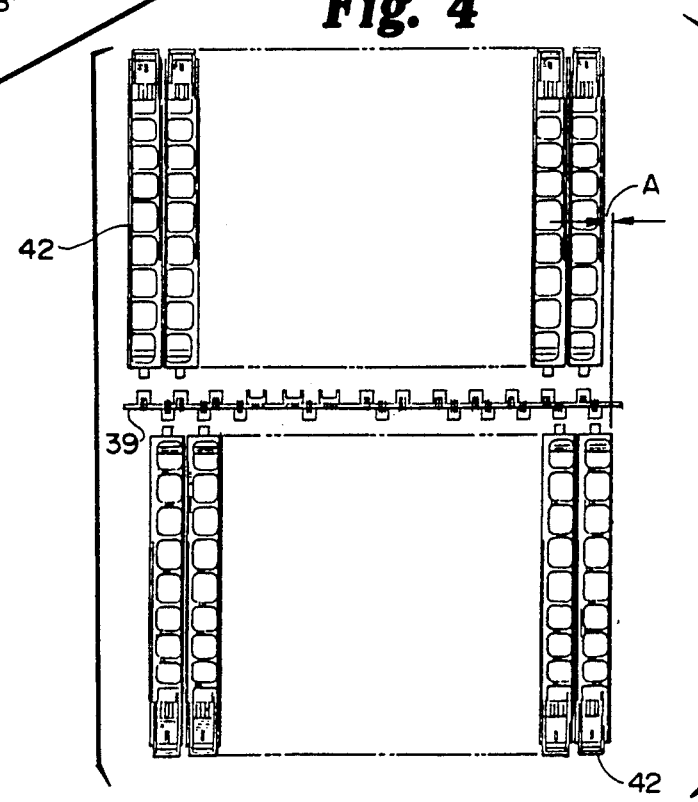
FIG. 4 is a top view of the backplane used with the double-sided logic cage of the present invention showing the relationship between the logic elements and the backplane.

FIG. 4 shows how the logic elements 42 are aligned for connection to the backplane card 39 that is contained within backplane assembly 38. For convenience and ease of understanding, the logic elements 42 and the backplane card 39 are shown broken out from the logic cage 20 and without the other cage elements described above. As can be seen from FIG. 4, the pitch or mechanical distance A between the logic elements 42, and thus the overall electrical pitch between the elements 42 (and any wiring between them) is one-half of the mechanical pitch or width of the logic elements 42. A particular advantage gained hereby is that twice as many logic elements 42 may be plugged into the backplane 39 as may be plugged into a backplane 8 used in a typical prior art logic cage 1. The reduction in electrical path length serves to minimize problems with bus design and enhances performance by shortening the wire length between the logic elements 42.

Figure 5:
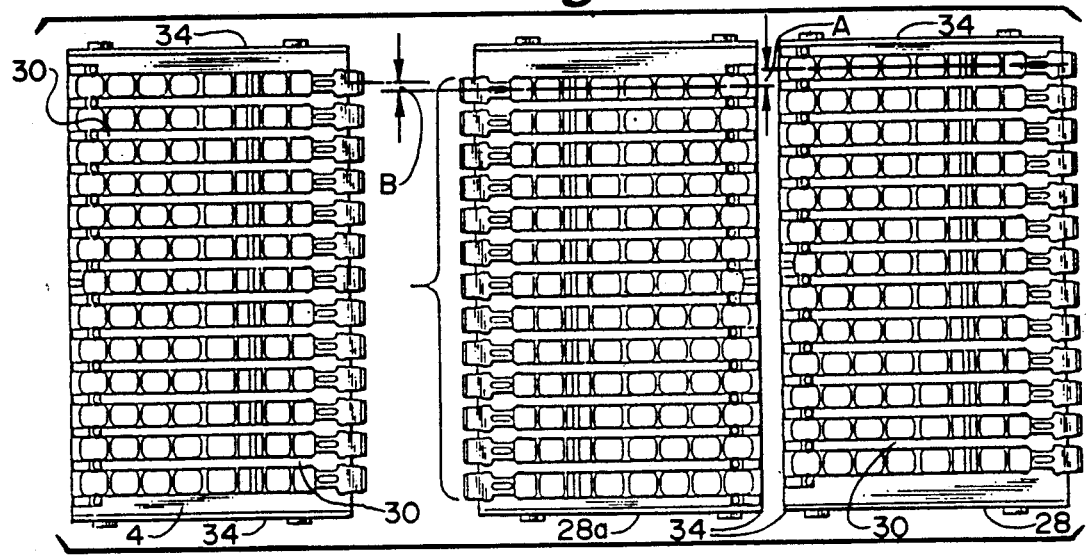
FIG. 5 is a top plan showing the inner surfaces of the logic element guides.

Additional detail and advantages related to the offset A are depicted in FIG. 5 which shows the logic elements 42 guide or locating slots 30 on the top and bottom guides 26, 28. Only the slots 30 of a bottom guide 28 (or 28a) are shown, but the top guide 26 exhibits the same characteristics on its inner surfaces.

FIG. 5 particularly shows how offset A is enabled and complemented by the location of the logic element 42 locating slots 30. It can be seen that the slots 30 are non-symmetric with respect to the lateral edges 34 of the bottom guide 28 or 28a. If the slots 30 were exactly symmetrical with the overall cage width and with lateral edges 34 (shown by prior art guide 4), offset A would not occur when a second identical bottom guide 4 is rotated 180° and used in the second of the dual back-to-back sub-cages 22, 24. Since the locating slots 30 on the bottom guide 28 and 28a are each biased a distance B from lateral edges 34 thereof, offset A (B+B) between guide 28 locating slots 30 and the slots of the guide 28a is achieved when they are back-to-back.

Offset B on the guides 26, 28 may be achieved in a number of ways. Examples include designing a bias into a die-casting tool used to form the guides 26, 28, inserting the tool so that guides 26, 28 with different offsets or biases may be made with one parent tool, or adding a separate spacer to the same side of symmetrical guides before they are rotated 180° and mounted back-to-back. These methods are not shown but may be understood from an examination of FIG. 5.

Thus, the applicants have discovered an economical and precise way to achieve the offset A, enabling performance improvements by shortening the wiring distance between back-to-back logic elements 42. Advantages achieved by guides 26, 28 include: improved logic element/backplane alignment, increased logic element density and increased part standardization resulting in lower manufacturing costs.

Figure 6:
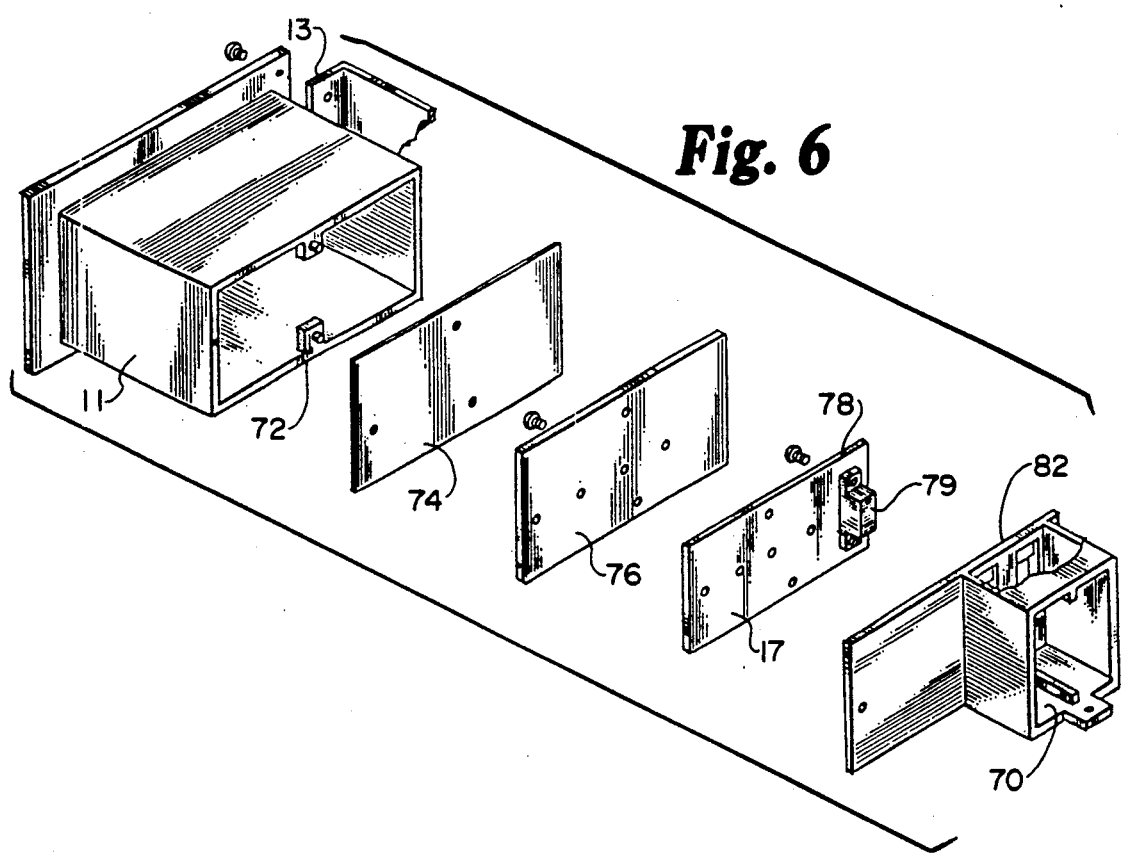
FIG. 6 is a substantially schematic view of an alternative embodiment of the logic cage of the present invention.

FIG. 6 depicts an alternative embodiment of the present invention. Specifically, it shows how a typical logic cage 11, shown mounted to a representative chassis 13, may be adapted to mount a selected number of logic elements (not shown) to the rear side 17 of backplane 78, thereby forming a mini-guide or logic cage 70 incorporated with a typical cage 11. The logic cage 11 is provided with a backplane locator/guide seat 72. The enclosure of the logic cage 11 is completed by mounting an EMC shield 74, a spacer 76, a backplane card 78 and a modified stiffener 82 sequentially on cage 11. The modified stiffener 82 is provided with a mini-cage 70 which may be of any desired size or configuration depending on the type and number of logic elements which are required. Also, the backplane card 78 is provided with the required connections 79 for the logic elements enclosed by the mini-cage 70. The scope of the present invention should be perceived to include other embodiments of the rear mini-logic cage 70. It does not necessarily need to be identical in width or capacity for logic elements to the front logic cage and the rear or mini-cage 70 may be formed of separate mechanical parts or integrated into existing structure, in the depicted example, the modified stiffener 82.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed:

1. In an enclosure for use in computing systems for operatively containing logic elements, said enclosure comprising a linked pair of back-to-back sub-enclosures, comprising a first sub-enclosure and a second sub-enclosure, each said sub-enclosure having a front open end for receiving said logic elements and a back closed end, said closed end of both said sub-enclosures being closed by a single intermediate double-sided backplane assembly;

the improvement in sub-enclosure construction comprising a guide plate for guiding and supporting said logic elements, said guide plate having a plurality of equal-spaced, parallel guide slots along one surface, said plurality of guide slots being offset from a centerline of said one surface by a distance "B," said guide plate having means for attachment to said backplane assembly along a transverse edge of said guide plate, whereby two of said guide plates may be attached in respective end-to-end opposing relationship to said backplane assembly to create an offset distance "2B" between respective end-to-end aligned logic elements; and the improvement in double-sided backplane assembly construction comprising a plurality of parallel rows of connectors aligned along one side of said backplane assembly at spaced intervals to receive logic elements guided by one of said two guide plates, and a plurality of rows of connectors aligned along the other side of said backplane assembly to receive logic elements guided by the other of said two guide plates, whereby rows of connectors on one side of said backplane assembly are offset from rows of connectors on the other side of said backplane assembly by a distance "2B."

2. The apparatus of claim 1, further comprising a first pair of said guide plates affixed along a first edge of said backplane assembly and a second pair of said guide plates affixed along a second edge of said backplane assembly; and a pair of unitary side plates respectively affixed to lateral edges of said guide plates, to thereby form said enclosure.

3. The apparatus of claim 2, wherein said guide plates of said first pair and said guide plates of said second pair are each respectively horizontally aligned, with respective guide slots in spaced apart parallel guide plates in alignment in respective vertical planes.

* * * * *